(12) United States Patent
Gilliland et al.

(10) Patent No.: US 7,485,813 B1
(45) Date of Patent: Feb. 3, 2009

(54) STACKED HOLE FORMED PATTERNS FOR SHIELDING THROUGH AN APERTURE

(75) Inventors: Don Alan Gilliland, Rochester, MN (US); Max John-Christopher Koschmeder, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/049,339

(22) Filed: Mar. 16, 2008

(51) Int. Cl.
*H05K 9/00* (2006.01)

(52) U.S. Cl. ........................ 174/383; 174/382; 454/184

(58) Field of Classification Search ................. 174/382, 174/383, 377; 361/816, 818, 692, 693; 454/184; 29/825
See application file for complete search history.

(56) References Cited

U.S. PATENT DOCUMENTS

| | | | |
|---|---|---|---|
| 4,746,765 A | 5/1988 | Mallott | |
| 5,113,161 A | 5/1992 | Inami et al. | |
| 6,297,446 B1 * | 10/2001 | Cherniski et al. | 174/383 |
| 6,334,539 B1 * | 1/2002 | Jajko et al. | 211/42 |
| 6,352,162 B1 * | 3/2002 | Yang et al. | 211/43 |
| 6,421,238 B1 * | 7/2002 | Negishi | 361/695 |
| 6,449,150 B1 * | 9/2002 | Boone | 361/694 |
| 7,199,310 B2 * | 4/2007 | Cochrane | 174/383 |
| 7,390,976 B2 * | 6/2008 | Liang et al. | 174/383 |
| 2006/0292975 A1 * | 12/2006 | Lin et al. | 454/184 |
| 2007/0007036 A1 | 1/2007 | Hashimoto et al. | |
| 2007/0155301 A1 * | 7/2007 | Chen et al. | 454/184 |
| 2008/0036049 A1 | 2/2008 | Lee et al. | |

FOREIGN PATENT DOCUMENTS

| | | |
|---|---|---|
| EP | 00470775 A1 | 8/1991 |
| GB | 02334144 A | 8/1999 |

* cited by examiner

*Primary Examiner*—Hung V Ngo
(74) *Attorney, Agent, or Firm*—MaxValueIP, LLC

(57) ABSTRACT

In one embodiment, this invention is about stacking of sheeted material after cuts. The patterns on the separate sheets are aligned for cuts to create through-holes in the stack. The cut material is not removed but simply bent back to form walls for the hole. The materials are pierced and stacked to form holes. Any additional extended walls to the hole can be formed just by adding an additional layer. One embodiment may be just 2 walls that form a 90 degree angle with respect to one another. The extended walls can be slightly bent along their lengths in order to increase their strengths and to ensure their perpendicular standing on the layers. In other embodiments, the extended walls can be equipped with extra features, such as latches, to secure the adjacent extended walls and ensure a 90 degree angle between them.

1 Claim, 8 Drawing Sheets

STACKED HOLE FORMED PATTERNS FOR SHIELDING THROUGH AN APERTURE

BACKGROUND OF THE INVENTION

Enclosing the electrical devices inside perforated boxes has been an efficient method to minimize or shield electromagnetic interference (EMI). The perforated layers of the box, or the electromagnetic shields, attenuate and ventilate the disturbing electromagnetic waves. In addition, the perforated surfaces have shown to allow a higher degree of dissipation of heat from electronic components usually enclosed in the box.

Efforts have been made to improve the efficiency of the electromagnetic shields by optimizing the size and shape of the holes made in the layers to form EMI resistive perforated shields. Resulted from previous observations, today, it is desired to fabricate a perforated metal pattern whose holes' depth is equal to one of its parameters. It is known from the deterministic relation for low impedances that increasing the depth of a perforated pattern improves its shielding effectiveness (SE):

$$SE=(20*\log((S*C^2)/S^3))+27.3*t/s$$

where t is the thickness, s is the square hole size, S is the pattern size, and C is the center spacing between holes. It should be noted that as thickness increases, the SE improves directly and steeply in dB, rather than its logarithm. Increasing the depth of the holes constitute applying more material which leads to higher cost and unwanted weight. A low cost and easy method of stacking enclosure thicknesses and producing an array of deeper holes on the perforated layers is needed to improve SE without needing to resort to more expensive, sophisticated and technologically challenging designs.

SUMMARY OF THE INVENTION

In one embodiment, this invention is about a simple stacking of sheeted material with cuts. The patterns on the separate sheets are aligned for cuts to create through-holes in the stack. The cut material is not removed but simply bent back to form walls for the hole. The materials are pierced and stacked to form holes. Any additional extended walls to the hole can be formed just by adding an additional layer. One embodiment may consist of only two sheets leading to just 2 walls that form a 90 degree angle with respect to one another. In another embodiment, the two sheets are patterned and cut in a way to create four shorter walls perpendicular to one another. The extended walls can be slightly bent along their lengths in order to increase their strengths and to ensure their perpendicular standing on the layers. In yet another embodiment, the extended walls can be equipped with extra features, such as latches, to secure the adjacent extended walls and ensure a 90 degree angle between them.

DETAILED DESCRIPTION OF THE PREFERRED EMBODIMENTS

Figure 1:
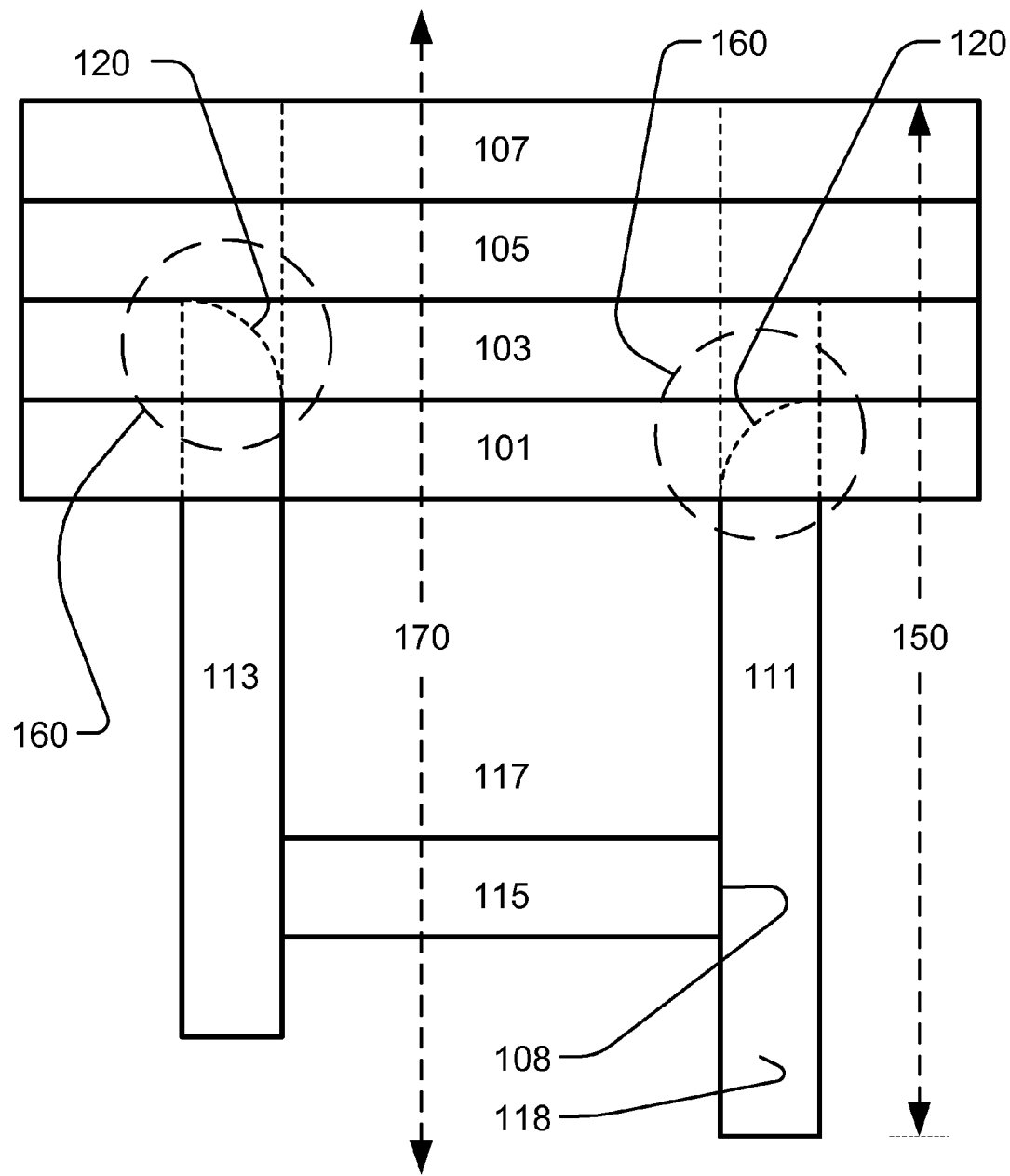
FIG. 1 shows the front view of a single completed hole in the perforated plane consisting of four planes showing the four extended walls (not to scale).
Figure 2:
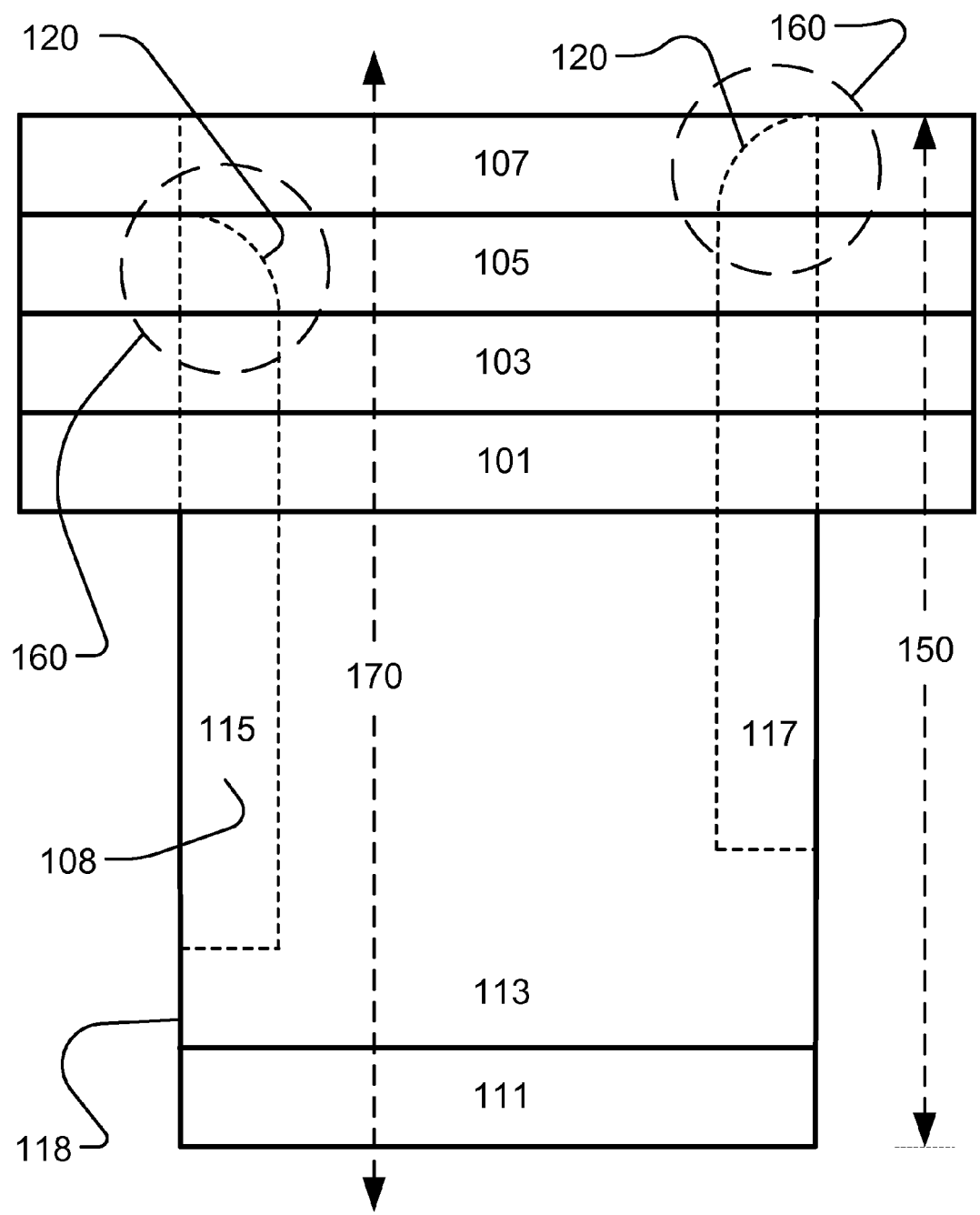
FIG. 2 shows the left view of a single completed hole in the perforated plane consisting of four planes showing the four extended walls (not to scale).

The drawings of FIGS. 1-8 show several different embodiments of the method. The embodiment shown in drawings of FIGS. 1 and 2 is a four sided four layer (101, 103, 105, 107) stack up that forms the four corresponding extended walls (111, 113, 115, 117) of the holes. In numerous embodiments, patterns of 1-, 2-, 3- or 4-extended-wall may be sufficient to suppress the emissions adequately. In this embodiment, The sheeted material is likely much thinner than 1 mm in thickness and the stack comprises of two plates (101 and 103) with square 6 mm holes and two plates (105 and 107) with 4 by 6 mm holes, therefore, requiring only two patterns. It is noted that, the stack up thickness will impact the depth of the holes and the height (e.g., 150) of the extended walls. In one embodiment, this invention is about a simple stacking of sheeted material with cuts. The cut patterns (e.g., 410, 510, 610, or 710) on the separate sheets (e.g., (101 & 103 & 105 & 107, 401 & 501) or (705 & 755)) are aligned to create through-holes (e.g., 170, (430 & 530), (630 & 640), or (730 & 740)) in the stack.

Figure 3:
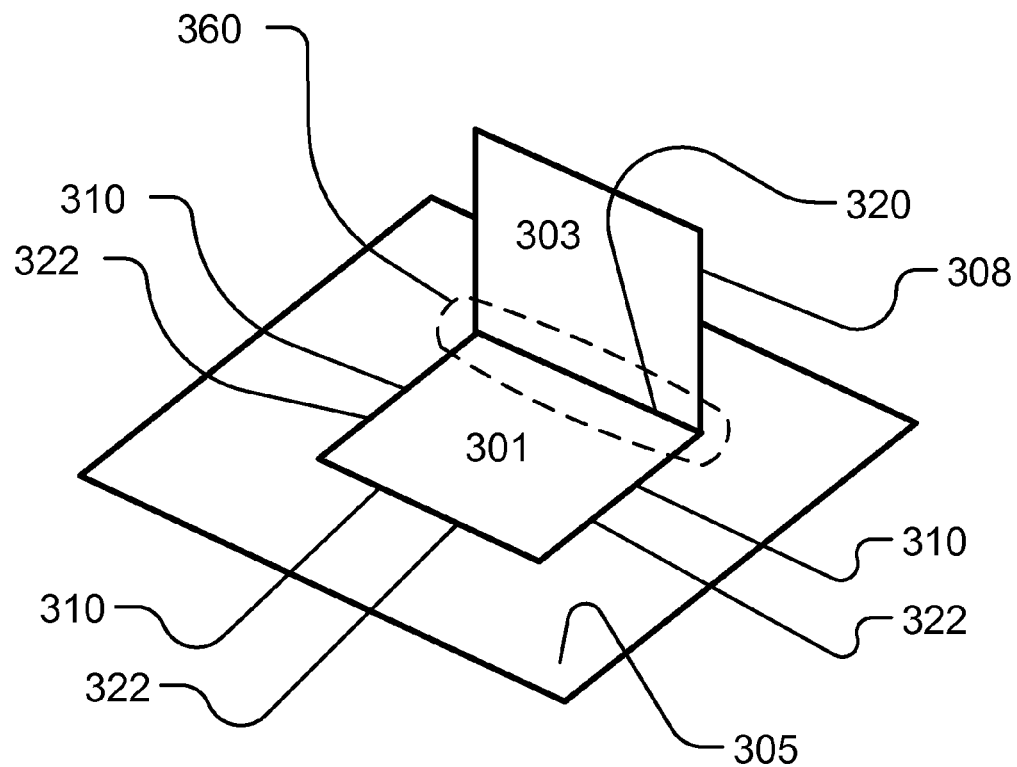
FIG. 3 schematically shows a perspective of the cut pattern and bending process for one layer (not to scale).
Figure 4:
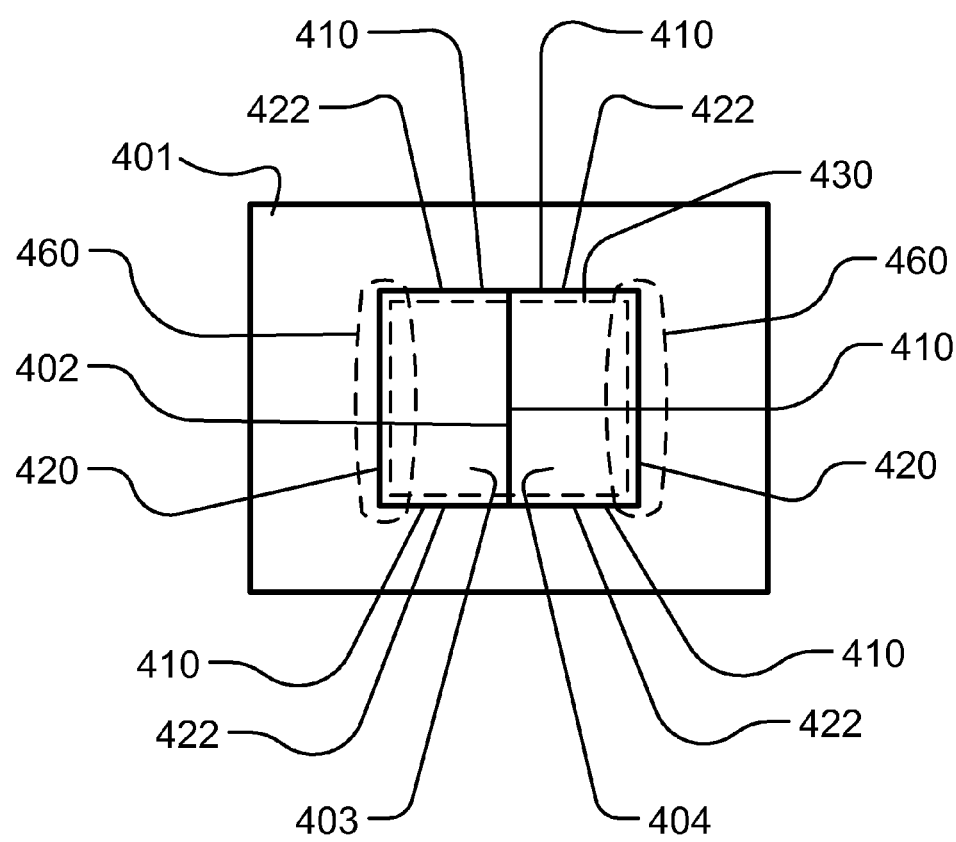
FIG. 4 illustrates the cutting pattern for the first layer in the two-layer stack design (not to scale).
Figure 5:
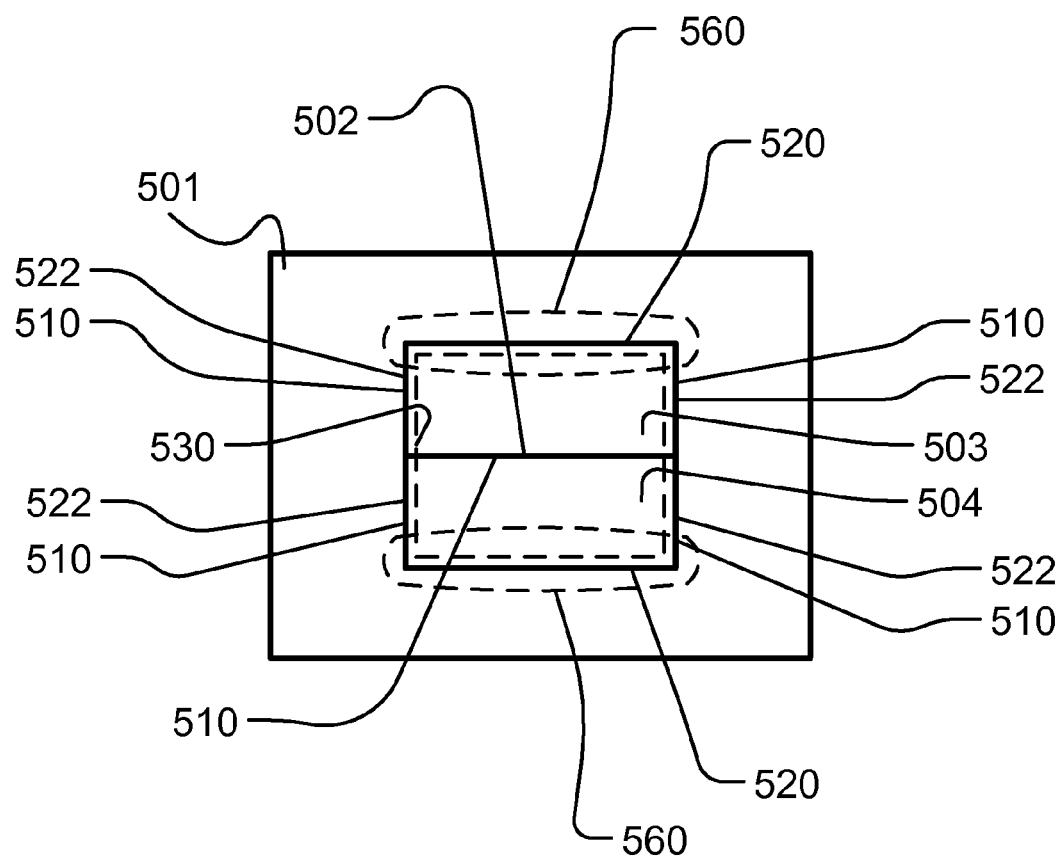
FIG. 5 illustrates the cutting pattern for the second layer in the two-layer stack design (not to scale).
Figure 6:
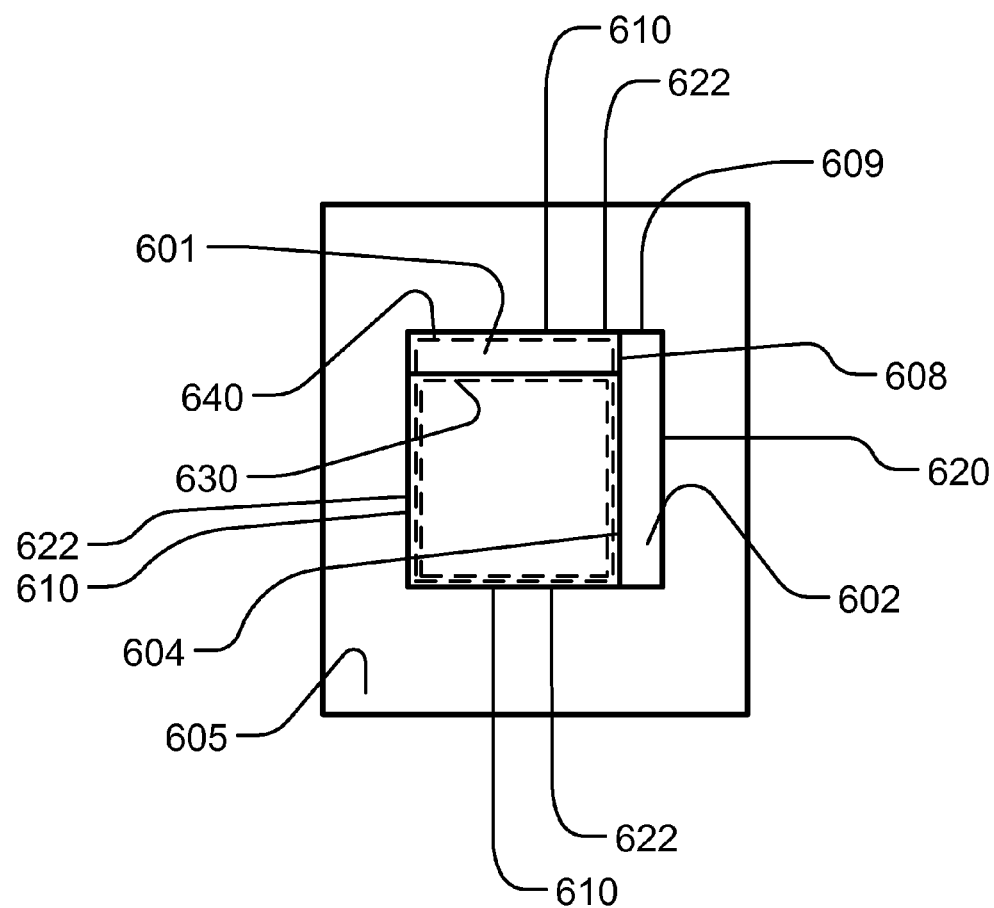
FIG. 6 schematically shows the two-perpendicular-extended-wall design (not to scale).
Figure 7:
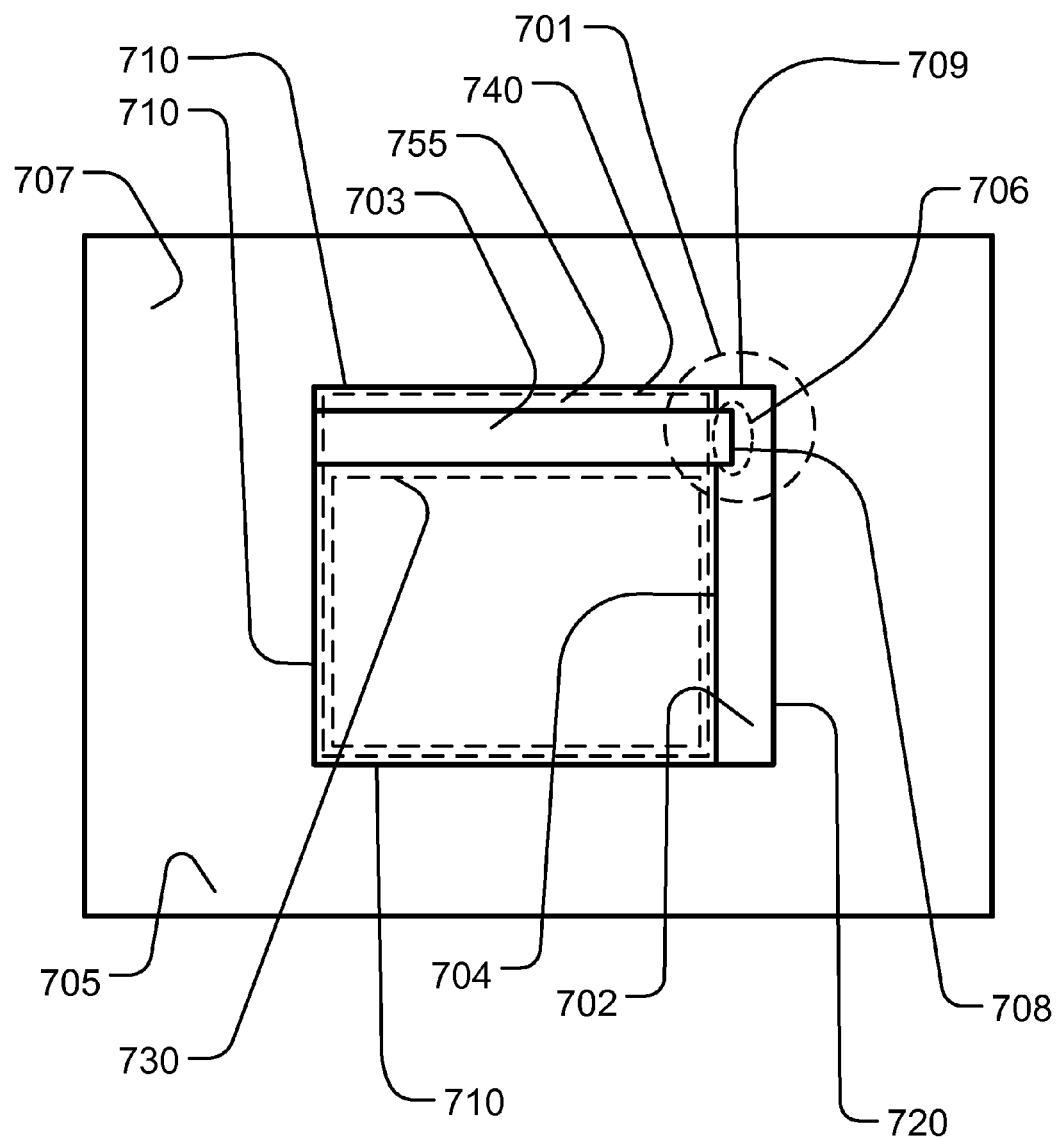
FIG. 7 schematically shows the two-perpendicular-extended-wall design with extra feature in one of the extended walls (not to scale).

As shown in example perspective of FIG. 3, the cut material is not removed from the main sheet (305) but is simply bent back (360) to form extended walls (303) for the hole (301). In this embodiment, materials are pierced and stacked to form holes. Any additional extended walls to the hole can be formed just by adding an additional layer. In one simpler embodiment only two sheets (e.g., 401 and 501) are used (e.g. FIGS. 4 and 5). This embodiment may comprise of the material (e.g., 401) with just a center shear (e.g., 402). The two walls (e.g., 403 & 404) are folded down (460) and then another layer (e.g., 501) with slightly smaller center shear (e.g., 502) is placed. Folding (560) also (e.g., 503 & 504) this layer fits together the layers to form a square hole with the desired depth (e.g., 150). The openings (e.g., 530, or also 301, 530, 630, 640, 730, 740) in the first (e.g., 501, or also 105, 305, 755) and the second (e.g., 401, or also 101, 305, 605, 705, 805) layers are cut (e.g., 410, 510, or also 310, 610, 710) as shown in the planar top view of FIG. 4 and FIG. 5 respectively. The cut material (e.g., 111, 113, 115, 117, 303, 403, 404, 503, 504, 601, 602, 702, 703, 802, and 803) is bent back (e.g., 160, 360, 460, and 560) to form the extended walls (e.g., 111, 113, 115, 117, 303, 403, 404, 503, 504, 601, 602, 702, 703, 802, and 803) and subsequently the openings (e.g., (430 & 530), (630 & 640), or (730 & 740)) are aligned. One embodiment as shown in top view of FIG. 6 may be to form just two extended walls (601 and 602) that form a 90 degree angle with respect to one another using only two layers. Additional similar walls can be added as needed by adding extra layers. In one embodiment, as shown in FIG. 7, formed feature (e.g., 706) in one wall (e.g., 702) near the corner (701) could be added along the height of the wall sections (e.g., 702 and 703) to help secure the other wall (e.g., 703) normal to the surface (e.g., 707) and conveniently hold the stacked sheet-metal layers (e.g., 705 and 755) together. In other embodiments, features in different forms can be used to provide for intentional spacing (not shown) between the stacked layers of sheet-metal to also aid in the shielding effectiveness.

Figure 8:
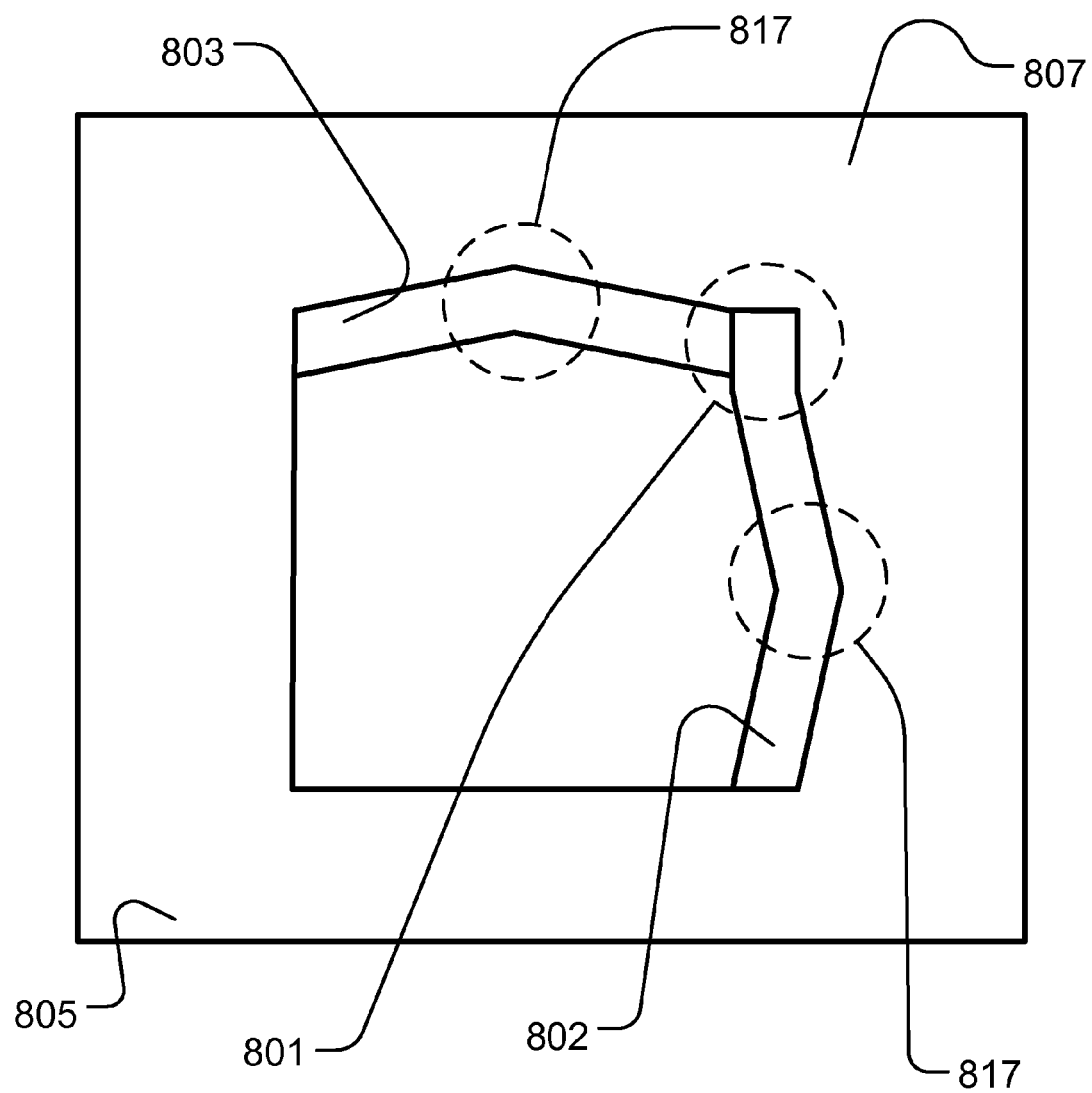
FIG. 8 is a schematic drawing of the "Hex" design for added wall strength (not to scale).

Other embodiments of this idea can apply differently shaped holes, such as Hex, Oval, or Oblong. In one example, the view in FIG. 8 shows an exaggerated form (817) down the middle of both walls (e.g., 802 and 803) to help hold them normal to the surface (807). In one embodiment, "Hex" shaped holes as in FIG. 8 have partially overlapping walls (801) for a beneficial capacitive effect in shielding. This is because overlapping walls form a capacitance at high frequency and therefore this design improves the coupling from side to side which will improve the waveguide response.

Other embodiments of this invention can also be used in packaging hole patterns in any electronic equipment, servers, etc, where EMI shielding is required, and in creating airflow patterns in server or any electronic equipment.

In one embodiment, an article of manufacture for shielding electromagnetic wave through aperture is presented. In this embodiment, the article of manufacture comprises of a plurality of conducting sheets (e.g., (101 & 103 & 105 & 107), (401 & 501), or (705 & 755)) wherein first conducting sheet (e.g., 105, 305, 501, or 755) of the plurality of conducting sheets has a first pattern of apertures, the first aperture (e.g., FIGS. 1-3, and 5-8) in the first pattern of aperture has a first opening (e.g., 301, 530, 630, or 730) on the first conducting sheet (e.g., 105, 305, 501, or 755) and first one or more walls (e.g., 115, 303, (503 & 504), 601, 703, or 803), a first wall (e.g., 115, 303, (503 or 504), 601, 703, or 803) of the first one or more walls is a first portion of the first conducting sheet (e.g., 105, 305, 501, or 755) cut along a first cut path (e.g., 310 or 510) and bent (e.g., 160, 360, or 560) on a first uncut periphery portion (e.g., 120, 320, or, 520; or also 420, 620, 720) of the first opening (e.g., 301, 530, 630, or 730), at least a portion (e.g., 322 or 522; or also 422, 622) of the first cut path (e.g., 310 or 510) is on a periphery of the first opening (e.g., 301, 530, 630, or 730), the plurality of conducting sheets are stacked up in parallel (e.g., ((101 & 105), (401 & 501), or (705 & 755)), a second pattern of apertures of a second conducting sheet (e.g., 101, 401, 605, 705, or 805) of the plurality of conducting sheets aligns with the first pattern of apertures, a second aperture (e.g., FIGS. 1-2, 4, and 6-8) of the second pattern of apertures has a second opening (e.g., 430, 640 or 740) in the second conducting sheet (e.g., 101, 401, 605, 705, or 805) and second one or more walls (e.g., 111, (403 & 404), 602, or 702, 802), the first aperture aligns with the second aperture such that the first one or more walls (e.g., 115, 503, 601, 703, or 803) pass through the second opening (e.g., 430, 640 or 740), a first edge (e.g., 108, 308, 608, or 708) of the first wall (e.g., 115, 303, 601, or 703) contacts a surface (e.g., 604 or 704) of a second wall (e.g., 111, 404, 602, 702, or 802) of the second one or more walls, the second wall has an indentation (e.g., 706) along a second edge (e.g., 118, 609, or 709) of the second wall (e.g., 111, 404, 602, 702, or 802), and the indentation (e.g., 706) fits the first edge (e.g., 108, 308, 608, or 708) of the first wall (e.g., 115, 303, 601, or 703) to secure the first wall normal to the first conducting sheet (e.g., 105, 305, 501, or 755) at the first opening (e.g., 301, 530, 630, or 730).

A system, apparatus, or device (or method of manufacturing or assembling such a system) comprising one of the following items is an example of the invention: metal sheet, stacked sheets, shield, patterned substrate, antenna shield, microwave device, and radiation shield, corresponding to the article mentioned above, for purpose of shielding the radiation.

Any variations of the above teaching are also intended to be covered by this patent application.

The invention claimed is:

1. An article of manufacture for shielding electromagnetic wave through aperture, said article of manufacture comprising:
   a plurality of conducting sheets, wherein said conducting sheets shield electromagnetic wave;
   wherein a first conducting sheet of said plurality of conducting sheets has a first pattern of apertures;
   wherein a first aperture in said first pattern of apertures has a first opening on said first conducting sheet and first one or more walls;
   wherein a first wall of said first one or more walls is a first portion of said first conducting sheet cut along a first cut path and bent on a first uncut periphery portion of said first opening;
   wherein at least a portion of said first cut path is on a periphery of said first opening;
   wherein said plurality of conducting sheets are stacked up in parallel;
   wherein a second pattern of apertures of a second conducting sheet of said plurality of conducting sheets aligns with said first pattern of apertures;
   wherein a second aperture of said second pattern of apertures has a second opening in said second conducting sheet and second one or more walls;
   wherein said first aperture aligns with said second aperture such that said first one or more walls pass through said second opening;
   wherein a first edge of said first wall contacts a surface of a second wall of said second one or more walls;
   wherein said second wall has an indentation along a second edge of said second wall; and
   wherein said indentation fits said first edge of said first wall to secure said first wall normal to said first conducting sheet at said first opening.

* * * * *